United States Patent
Huttunen et al.

(10) Patent No.: US 11,822,235 B2
(45) Date of Patent: Nov. 21, 2023

(54) METHOD FOR ROLL-TO-ROLL IMPRINTING OF COMPONENTS

(71) Applicant: Teknologian tutkimuskeskus VTT Oy, Espoo (FI)

(72) Inventors: Olli-Heikki Huttunen, Espoo (FI); Johanna Hiitola-Keinänen, Espoo (FI); Jenni Tomperi, Espoo (FI)

(73) Assignee: TEKNOLOGIAN TUTKIMUSKESKUS VTT OY, Espoo (FI)

( * ) Notice: Subject to any disclaimer, the term of this patent is extended or adjusted under 35 U.S.C. 154(b) by 2 days.

(21) Appl. No.: 17/413,935

(22) PCT Filed: Dec. 9, 2019

(86) PCT No.: PCT/FI2019/050877
§ 371 (c)(1),
(2) Date: Jun. 14, 2021

(87) PCT Pub. No.: WO2020/120836
PCT Pub. Date: Jun. 18, 2020

(65) Prior Publication Data
US 2022/0043339 A1 Feb. 10, 2022

(30) Foreign Application Priority Data
Dec. 14, 2018 (FI) .................................. 20186077

(51) Int. Cl.
*G03F 7/00* (2006.01)
*B29C 59/02* (2006.01)
*B82Y 40/00* (2011.01)

(52) U.S. Cl.
CPC ............ *G03F 7/0002* (2013.01); *B29C 59/02* (2013.01); *B82Y 40/00* (2013.01)

(58) Field of Classification Search
CPC ........ G03F 7/0002; B29C 59/02; B82Y 40/00
See application file for complete search history.

(56) References Cited

U.S. PATENT DOCUMENTS

2008/0160457 A1* 7/2008 Collins ................. G03F 7/2028 355/70
2009/0001620 A1* 1/2009 Forrest ............. B29D 11/00365 425/90

(Continued)

FOREIGN PATENT DOCUMENTS

EP      0544529 A1    6/1993
WO    2008124180 A1   10/2008

OTHER PUBLICATIONS

Ahn, Se Hyun and Guo, L. Jay, "High-Speed Roll-to-Roll Nanoimprint Lithography on Flexible Plastic Substrates", 2008, Advanced MAterials vol. 20, Issue 11, pp. 2044-2049 (Year: 2008).*

(Continued)

*Primary Examiner* — Michael M. Robinson
*Assistant Examiner* — Victoria Bartlett
(74) *Attorney, Agent, or Firm* — Merchant & Gould P.C.

(57) ABSTRACT

Method for roll-to-roll imprinting of components, in which method an imprint resist material layer (5) is applied on a substrate material layer (1) before imprinting the resist layer with a roll mold (3), wherein the imprint resist material (5) is applied on the substrate material layer (1) so, that the imprint resist material layer extends over the side edges of the substrate material layer and on the opposite side of the substrate material layer in relation to the imprinting surface of the substrate material layer in the cross-section of the substrate material layer together with the applied imprint resist material layer.

8 Claims, 1 Drawing Sheet

(56) References Cited

U.S. PATENT DOCUMENTS

Figure 1:
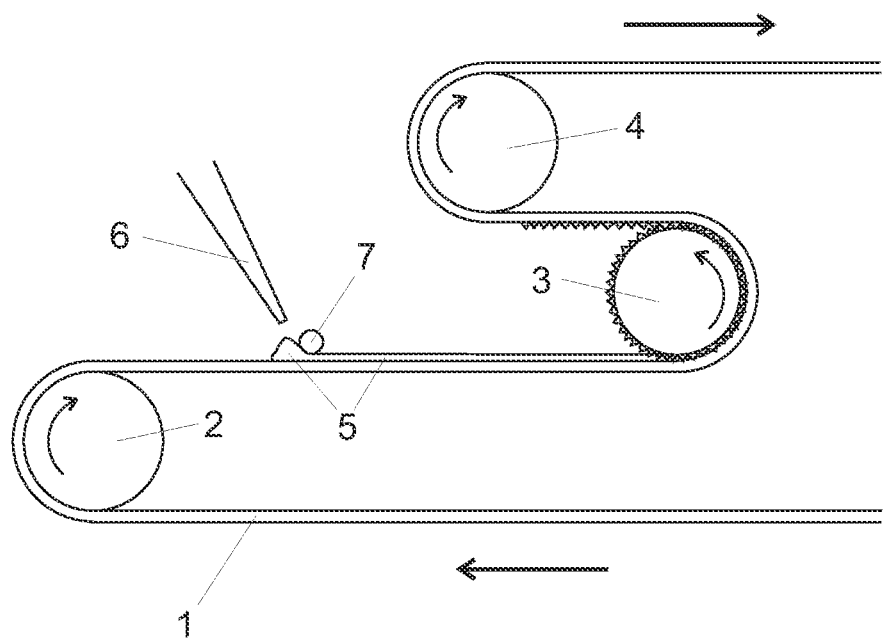

2009/0046362 A1    2/2009   Guo et al.
2012/0204745 A1    8/2012   Vo et al.
2014/0151733 A1    6/2014   Koike et al.
2016/0332341 A1*   11/2016   Iwase .................... G03F 7/0002

OTHER PUBLICATIONS

International Search Report of the International Searching Authority issued in corresponding International Patent Application No. PCT/FI2019/050877, dated Feb. 27, 2020, 3 pages.
Narzin Kooy, et al., "A review of roll-to-roll nanoimprint lithography", Nanoscale Research Letters, Jun. 25, 2014, p. 320, vol. 9, No. 1.

\* cited by examiner

METHOD FOR ROLL-TO-ROLL IMPRINTING OF COMPONENTS

This application is a National Stage Application of PCT/FI2019/050877, filed 9 Dec. 2019, which claims benefit of Serial No. 20186077, filed 14 Dec. 2018 in Finland and which applications are incorporated herein by reference. To the extent appropriate, a claim of priority is made to each of the above-disclosed applications.

The present invention relates to roll-to-roll imprinting, where resist material is applied on a substrate material and then the resist material on the substrate material is molded with a mold in form of a roll.

Roll-to-roll imprinting is a replicating method, which is based on curing reactive monomers or prepolymers, i.e. resist, in a mold. Roll-to-roll imprinting is used for fabrication of different types components, which typically require specific structures in the scale of micrometers or nanometers. The application areas include different types of electronic, optic and microfluidic components, for example.

In roll-to-roll imprinting the components are typically formed on a continuous web-type substrate material by first applying an imprint resist material on the substrate material and then molding the resist material to desired shapes with a roll mold and curing the resist material with heat or UV-light, for example. After the molding and curing of the resist material on the substrate material, further process steps may be performed depending on the components to be produced, such as depositing a layer of metal on top of the resist material and then removing the resist material to form finalized components on the substrate material (lithography), for example.

The roll-to-roll imprinting technologies provide simple, cost efficient and high-throughput processes for replicating micro- and nanoscale patterns.

One of the key challenges in the roll-to-roll imprinting process is to manage the adhesion between different material layers. The adhesion between resist material layer and substrate material layer should be significantly higher than adhesion between resist material layer and the mold. In some applications it is preferable to use materials as resist material which have characteristically low adhesion to the substrate material, which significantly increases the possibility of the resist material sticking to the mold.

This sticking problem is significantly enhanced with components comprising negative side wall structures, which negative sidewalls or sidewall structures creates a joint of mating forms, or a plurality of such joints, between the resist material and the imprinting roll mold. Such negative side walls or side wall structures would be beneficial in microfluidic components and in lithography, for example. The resist material used in these components comprising negative side walls or side wall structures must be elastic material, which elastic material typically has a poor adhesion to the substrate material. Due to these problems, components with the negative sidewalls or sidewall structures cannot effectively be mass produced with roll-to-roll imprinting methods.

The present invention provides a solution for improving the fixing of the resist material to the substrate material without using any additional adhesive material layers, and allows for negative sidewalls or sidewall structures to be imprinted to the resist material in the roll-to-roll imprinting process.

In the present invention the imprint resist material is applied on the substrate material so, that the side edges of the resist material extend over the side edges of the substrate material and on the opposite surface of the substrate material in relation to the imprinting surface. This causes mechanical fixation via interlocking surfaces between the imprint resist material layer and the substrate material layer at the side areas of the substrate material layer, where the imprint resist material envelopes the side edges of the substrate material. This additional mechanical fixation significantly increases the adhesion between the resist material and the substrate material thus significantly decreasing the probability of resist material sticking to the mold during the imprinting.

In the method of the invention for roll-to-roll imprinting of components, in which method an imprint resist material layer is applied on a substrate material layer before imprinting the resist layer with a roll mold, wherein the imprint resist material is applied on the substrate material layer so, that the imprint resist material layer extends over the side edges of the substrate material layer and on the opposite side of the substrate material layer in relation to the imprinting surface of the substrate material layer in the cross-section of the substrate material layer together with the applied imprint resist material layer.

In an embodiment of the method of the invention the sections of the resist material layer extending over the side edges of the substrate material layer and on the opposite side of the substrate material layer are cured at the latest at the roll mold. Preferably the curing of all of the resist material is done at the same time at the roll mold.

In an embodiment of the method of the invention roll mold comprises negative sidewall surfaces. In this context negative sidewall surfaces mean surface that when pressed in the resist material form mating forms that resist the detachment of the imprinted resist material from the mold surface.

In an embodiment of the method of the invention the resist material is elastic material. The elasticity in this context means that the material allows for the required deformation after curing during removal of the resist material from the roll mold and returning back to the original imprinted form after detachment, or to substantially same form after detachment. This elasticity requirement is especially important when imprinting the mentioned negative sidewalls and sidewall structures, wherein the elasticity of the resist material allows the detachment of the resist material from the surface of the mold in the places of joints of mating forms between the resist and the mold surface.

In an embodiment of the method of the invention the resist material comprises polysiloxane material, preferably polydimethyl siloxane (PDMS) and/or its derivatives such as cross-linked silicone elastomers, for example.

In an embodiment of the method of the invention the substrate material is suitable plastic film material. The substrate material may be thermoplastic of thermosetting material. One example for the substrate material is polyethylene terephthalate (PET). It is to be noted, however, that the present invention allows a wider variety of different suitable substrate materials in comparison to traditional roll-to-roll imprinting processes, since the adhesion for the resist material provided by the substrate material is not a key factor in selection of the substrate material.

In an embodiment of the method of the invention the manufactured components are microfluidic, micromechanical and/or optical components.

The features defining a method of the invention are more precisely presented in claim 1. Dependent claims disclose advantageous features and embodiments of the invention.

Figure 2:
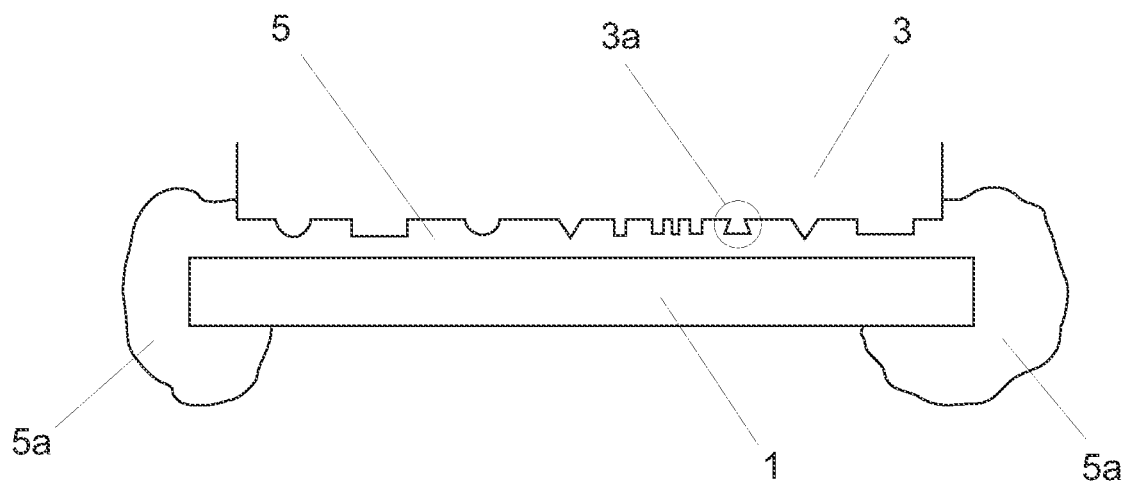

In the following an embodiment of the invention is discussed in greater detail in the sense of example and with reference to accompanying drawings, where FIG. 1 shows schematically an embodiment of a process for producing components with roll-to-roll imprinting suitable for the present invention, and FIG. 2 shows schematically an embodiment of a component of the present invention as a cross-section in the imprinting stage.

In the schematically shown embodiment of a roll-to-roll imprinting process of FIG. 1 substrate material 1 in web form is conveyed via rotating rolls 2, 3 and 4 in the direction shown by the arrows in the figure. The second roll 3 of the rolls is the roll mold, and before the roll mold 3 resist material 5 is applied as a layer on the substrate material 1 with suitable means, such as through nozzle 6 and roll 7, which roll 7 spreads and levels the applied resist material 5 to a substantially level layer covering the width of the substrate material layer. The leveled resist material 5 on the substrate material 1 is then conveyed to roll mold 3 for imprinting the required shapes for the components to be produced on the resist material layer. During the imprinting with roll mold 3, the resist material 5 is also cured, for example with heat or UV-light.

After the imprinting stage with mold roll 3, the imprinted resist material 5 layer together with the substrate material 1 web is conveyed to required further steps, such as coating, printing, lamination and/or cutting, for example.

FIG. 2 shows schematically a cross-section of the resist material 5 layer on the substrate material 1 web during imprinting with roll mold 3.

In the application of the resist material 5 on the substrate material 1 in the present invention the resist material is applied on the substrate material web sufficiently large quantities, that during spreading and levelling with roll 7 the resist material is forced to cover the whole of the application surface of the substrate material and over the side surfaces of the substrate material, so that portions 5a of the resist material covers the side surfaces of the resist material web and extends on the opposite side of the substrate material web in relation to the application surface.

When sufficiently large amount of resist material 5 is applied on the substrate material 1 web, the some of the resist material spreads over the edges of the substrate material web and on the opposite side of the substrate material and remains there, mainly due to the surface tension of the resist material and the adhesion between the resist material and the substrate material. During the application of resist material 5 on the substrate material 1 web, some of the applied resist material may drop from the substrate material for guaranteeing the sufficient spreading of the resist material on the opposite side of the substrate material web. Where necessary, suitable guiding surfaces may be used to enhance the spreading of the resist material to the opposite side of the substrate material web.

The side portions 5a of the resist material 5 layer forms thus mechanical fixation of the resist material layer on the substrate material 1 web, so that the resist material layer remains on the substrate material web during the imprinting with roll mold 3, even when the imprinted shapes comprises negative sidewall forms, as in portion 3a of the roll mold.

The specific exemplifying embodiment of the invention shown in figures and discussed above should not be construed as limiting. A person skilled in the art can amend and modify the embodiment in many evident ways within the scope of the attached claims. Thus, the invention is not limited merely to the embodiment described above.

The invention claimed is:

1. A method for roll-to-roll imprinting of components on a substrate material web, the substrate material web having a first side with an imprinting surface, a second side opposite the first side, and side surfaces; the method comprising:
    applying an imprint resist material layer of an imprint resist material on the substrate material web, wherein the imprint resist material is applied on the first side of the substrate material web,
    spreading the imprint resist material applied on the first side of the substrate material web so that the imprint resist material applied on the first side of the substrate material web extends over the side surfaces of the substrate material web and the imprint resist material applied on the first side of the substrate material web extends onto the second side of the substrate material web opposite the imprinting surface of the substrate material web with the applied imprint resist material layer; and
    imprinting the resist layer with a roll mold;
wherein during the imprinting the resist layer with a roll mold, the imprint resist material is cured so that the imprint resist material layer is mechanically fixed onto the substrate material web as a result of the cured imprint resist material being located on the first side of the substrate material web and extending over the side surfaces of the substrate material web and on the second side of the substrate material web.

2. The method according to claim 1, wherein sections of the resist material layer extending over the side surfaces of the substrate material web and on the second side of the substrate material web are cured no later than at the roll mold.

3. The method according to claim 1, wherein the roll mold comprises negative sidewall surfaces.

4. The method according to claim 1, wherein the imprint resist material is an elastic material.

5. The method according to claim 1, wherein the imprint resist material comprises polysiloxane.

6. The method according to claim 1, wherein the substrate material web is plastic film material.

7. The method according to claim 1, wherein the components are microfluidic, micromechanical and/or optical components.

8. The method according to claim 1, wherein the imprint resist material comprises polydimethyl siloxane (PDMS) and/or derivatives of polydimethyl siloxane.

* * * * *